US008324981B2

(12) United States Patent
Ohi et al.

(10) Patent No.: US 8,324,981 B2
(45) Date of Patent: Dec. 4, 2012

(54) COMPOSITE BALUN

(75) Inventors: Shoichi Ohi, Tokyo (JP); Naoto Ohyama, Tokyo (JP)

(73) Assignee: TDK Corporation, Tokyo (JP)

( * ) Notice: Subject to any disclaimer, the term of this patent is extended or adjusted under 35 U.S.C. 154(b) by 281 days.

(21) Appl. No.: 12/774,972

(22) Filed: May 6, 2010

(65) Prior Publication Data

US 2010/0301962 A1 Dec. 2, 2010

(30) Foreign Application Priority Data

May 26, 2009 (JP) ................................ 2009-126349

(51) Int. Cl.
*H03H 7/42* (2006.01)
*H01P 3/08* (2006.01)

(52) U.S. Cl. ........................................ 333/25; 333/238

(58) Field of Classification Search .................... 333/25, 333/26, 4, 238
See application file for complete search history.

(56) References Cited

U.S. PATENT DOCUMENTS

| | | | | |
|---|---|---|---|---|
| 5,949,299 | A | 9/1999 | Harada | |
| 6,788,164 | B2 * | 9/2004 | Maekawa et al. | 333/26 |
| 7,348,842 | B2 * | 3/2008 | Ichitsubo et al. | 330/66 |
| 7,397,328 | B2 * | 7/2008 | Yasuda et al. | 333/204 |
| 8,228,133 | B2 * | 7/2012 | Motoyama et al. | 333/25 |
| 2005/0116787 | A1 | 6/2005 | Ohi et al. | |
| 2007/0236306 | A1 | 10/2007 | Kearns et al. | |

FOREIGN PATENT DOCUMENTS

| | | |
|---|---|---|
| JP | 10-200360 | 7/1998 |
| JP | 2000-188218 | 7/2000 |
| JP | 2002-33216 | 1/2002 |
| JP | 2002-329611 | 11/2002 |
| JP | 2004-201333 | 7/2004 |
| JP | 2004-304615 | 10/2004 |
| JP | 2004-320561 | 11/2004 |
| JP | 2005-109864 | 4/2005 |
| JP | 2005-166702 | 6/2005 |
| JP | 2007-282231 | 10/2007 |

OTHER PUBLICATIONS

Office Action issued May 25, 2011, in Japan Patent Application No. 2009-126349 (with English translation).

* cited by examiner

*Primary Examiner* — Dean O Takaoka
(74) *Attorney, Agent, or Firm* — Oblon, Spivak, McClelland, Maier & Neustadt, L.L.P.

(57) ABSTRACT

A composite balun includes a plurality of baluns, at least one capacitor, a ground terminal, and a DC voltage supply terminal. The plurality of baluns and the capacitor are built into a single chip. Each of the baluns includes first to fourth connection lines, a first balanced terminal, a second balanced terminal, and an unbalanced terminal. The first connection line is connected at one end to the unbalanced terminal. The second connection line is connected at one end to the other end of the first connection line. The third connection line is electromagnetically coupled to the first connection line and connected at one end to the first balanced terminal and at the other end to the DC voltage supply terminal. The fourth connection line is electromagnetically coupled to the second connection line and connected at one end to the second balanced terminal and at the other end to the DC voltage supply terminal. The capacitor is connected at one end to the DC voltage supply terminal and led at the other end to said ground terminal.

4 Claims, 7 Drawing Sheets

Unblanced Terminals; T12,T15,T18

Blanced Terminals; T1,T2,T5,T6,T8,T9

Ground Terminals; T3,T4,T7,T10,T11,T13,T14,T16,T17,T19

DC Voltage Supply Terminal; T20

COMPOSITE BALUN

BACKGROUND OF THE INVENTION

1. Field of the Invention

The present invention relates to a composite balun for connecting a balanced transmission line and an unbalanced transmission line.

2. Description of the Related Art

A multilayer chip balun has been known as a balanced-unbalanced transformer for transmission lines in a high-frequency circuit. In general, the balun includes first and second line portions constituting a pair of balanced transmission lines, third and fourth line portions constituting a single unbalanced transmission line to be electromagnetically coupled to the balanced transmission lines, a ground electrode, and a laminate that is composed by stacking a plurality of dielectric sheets. Moreover, the first and third line portions are electromagnetically coupled at portions opposing one another across the dielectric sheet to form a coupler, while the second and fourth line portions are similarly electromagnetically coupled at portions opposing one another across the dielectric sheet to form a coupler.

In the days when only one balun was built into a single chip, when incorporating a plurality of baluns into a mobile communication apparatus such as a mobile phone or a wireless LAN device, it is required to save an area of a printed circuit board for mounting a plurality of chips. This has led to a problem of increasing the size of the communication apparatus, but there has been made an attempt to solve this problem.

For example, Japanese Unexamined Patent Application Publication No. 2002-329611 discloses a multilayer composite balun with a plurality of baluns, wherein each balun is composed by stacking a pair of balanced transmission lines, an unbalanced transmission line electromagnetically coupled to the pair of balanced transmission lines through a dielectric layer, a ground electrode opposed to at least either of the balanced and unbalanced transmission lines across the dielectric layer, and a plurality of dielectric layers.

In the case where such a composite balun is disposed at a pre-stage of a power amplifier (PA) of a mobile communication apparatus to let the balun provide a differential input to the power amplifier, or in the case where the composite balun is disposed at a post-stage of a radio frequency integrated circuit (RFIC) to supply power to the radio frequency integrated circuit through the balun, it is required that a DC voltage is supplied to the power amplifier or the radio frequency integrated circuit through the composite balun. However, Japanese Unexamined Patent Application Publication No. 2002-329611 fails to disclose a configuration which meets the above requirement.

In order to supply a DC voltage to the power amplifier or the radio frequency integrated circuit through the composite balun, moreover, measures should be taken against noise entering through a power supply circuit, but Japanese Unexamined Patent Application Publication No. 2002-329611 also fails to disclose such means.

SUMMARY OF THE INVENTION

It is an object of the present invention to provide a composite balun useful for the case where a DC voltage should be supplied to a power amplifier or a radio frequency integrated circuit.

It is another object of the present invention to provide a composite balun in which measures are taken against noise entering through a power supply circuit in the case where a DC voltage should be supplied to a power amplifier or a radio frequency integrated circuit.

It is still another object of the present invention to provide a composite balun whose terminal structure enables facilitation or simplification of connection patterns on a circuit board for mounting the composite balun.

In order to achieve at least one of the above objects, the present invention provides a composite balun comprising a plurality of baluns, at least one capacitor, a ground terminal, and a DC voltage supply terminal. The plurality of baluns are built into a single chip. Each of the baluns includes first to fourth connection lines, a first balanced terminal, a second balanced terminal, and an unbalanced terminal.

The first connection line is connected at one end to the unbalanced terminal, while the second connection line is connected at one end to the other end of the first connection line.

In addition, the third connection line is electromagnetically coupled to the first connection line and connected at one end to the first balanced terminal and at the other end to the DC voltage supply terminal. The fourth connection line is electromagnetically coupled to the second connection line and connected at one end to the second balanced terminal and at the other end to the DC voltage supply terminal.

Moreover, the capacitor is connected at one end to the DC voltage supply terminal and led at the other end to said ground terminal.

In the composite balun according to the present invention, the plurality of baluns constituting the principal part are built into the single chip, so that when incorporating the plurality of baluns into a mobile communication apparatus such as a mobile phone or a wireless LAN, what is required is just to save an area of a printed circuit board for mounting the single chip, which meets the miniaturization requirement.

In each of the plurality of baluns, then, the first connection line is connected at one end to the unbalanced terminal, while the second connection line is connected at one end to the other end of the first connection line. In addition, the third connection line is electromagnetically coupled to the first connection line and connected at one end to the first balanced terminal, while the fourth connection line is electromagnetically coupled to the second connection line and connected at one end to the second balanced terminal. Therefore, there is obtained a composite balun where the third and fourth connection lines serve as a balanced transmission line and the first and second connection lines serve as an unbalanced transmission line.

On the other hand, the other end of the third connection line and the other end of the fourth connection line are connected to the DC voltage supply terminal, so that when a power amplifier or a radio frequency integrated circuit requires a DC voltage, the DC voltage can usefully be supplied through the composite balun according to the present invention.

Moreover, since the capacitor is connected at one end to the DC voltage supply terminal and led at the other end to the ground terminal, noise entering through a power supply circuit can be absorbed by the capacitor. Furthermore, since the capacitor is built into the single chip along with the plurality of baluns, the mounting process becomes easier and the mounting area of the circuit board can be reduced as compared with the case where the capacitor is disposed outside the composite balun.

Preferably, the chip has a rectangular bottom face, and the first balanced terminals and the second balanced terminals are arranged on the bottom face along one common side.

With this configuration, since all the first and second balanced terminals are arranged along one side of the bottom face, conductor patterns (connecting terminals) corresponding to the first and second balanced terminals can be arranged in a row on the circuit board for mounting the composite balun, which enables facilitation or simplification of the connecting conductor patterns on the circuit board.

The other objects, constructions and advantages of the present invention will be further detailed below with reference to the attached drawings. However, the attached drawings show only illustrative examples.

DESCRIPTION OF THE PREFERRED EMBODIMENTS

Figure 1:
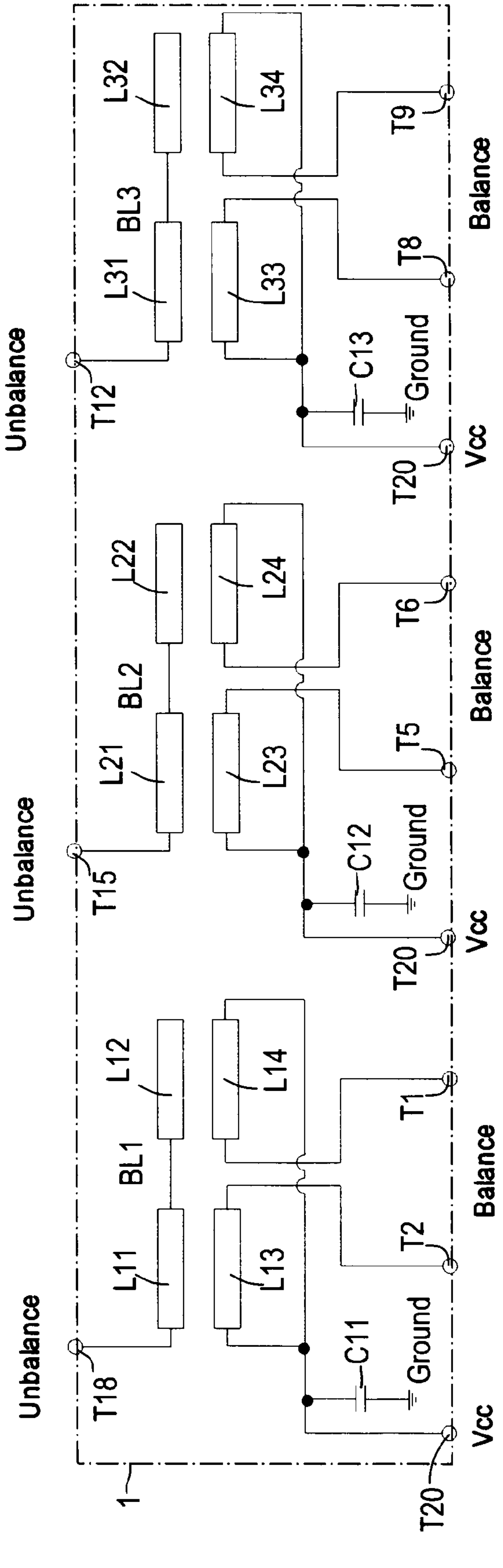
FIG. 1 is a circuit diagram showing a configuration of a composite balun according to the present invention.

Referring to FIG. 1, a composite balun according to the present invention includes a plurality of baluns BL1 to BL3, capacitors C11 to C13, a ground terminal, and DC voltage supply terminals T20. The minimum number of baluns BL1 to BL3 is two, though three baluns are provided in the present embodiment. In the present embodiment, the capacitors C11 to C13 are provided according to the number of baluns BL1 to BL3, but not limited thereto.

The baluns BL1 to BL3 and the capacitors C11 to C13 are built into a single chip 1. The chip 1 is typically composed of a hexahedral ceramic dielectric body, in which necessary conductor patterns are embedded in layers and electrically connected to one another via through-electrodes arranged between layers.

Each of the baluns BL1 to BL3 includes first to fourth connection lines (L11 to L14) to (L31 to L34), a first balanced terminal (T2, T5, T8), a second balanced terminal (T1, T6, T9), and an unbalanced terminal (T15, T18, T12).

The baluns BL1 to BL3 have the same basic configuration. However, since their resonance frequencies are different from each other, they are different in pattern and length of the connection line. The baluns BL1 to BL3 are individually described in the following.

In the balun BL1, firstly, the first connection line L11 is connected at one end to the unbalanced terminal T18, while the second connection line L12 is connected at one end to the other end of the first connection line L11. The third connection line L13 is electromagnetically coupled to the first connection line L11 and connected at one end to the first balanced terminal T2 and at the other end to the DC voltage supply terminal T20. The fourth connection line L14 is electromagnetically coupled to the second connection line L12 and connected at one end to the second balanced terminal T1 and at the other end to the DC voltage supply terminal T20.

The first to fourth connection lines L11 to L14 are formed as a stripline which has a line length of λ/4 with respect to the wavelength λ of a target frequency signal. The first and third connection lines L11, L13 are opposed to each other across a ceramic dielectric layer to thereby cause electromagnetic coupling. Similarly, the second and fourth connection lines L12, L14 are opposed to each other across a ceramic dielectric layer to thereby cause electromagnetic coupling.

The capacitor C11 is connected at one end to the DC voltage supply terminal T20 and led at the other end to a ground terminal. The capacitor C11 includes at least one pair of electrodes opposed to each other across a ceramic dielectric layer forming the chip, and its capacity varies depending on the dielectric constant and thickness of the ceramic dielectric layer and the electrode area.

In the balun BL2, secondly, the first connection line L21 is connected at one end to the unbalanced terminal T15, while the second connection line L22 is connected at one end to the other end of the first connection line L21. The third connection line L23 is electromagnetically coupled to the first connection line L21 and connected at one end to the first balanced terminal T5 and at the other end to the DC voltage supply terminal T20. The fourth connection line L24 is electromagnetically coupled to the second connection line L22 and connected at one end to the second balanced terminal T6 and at the other end to the DC voltage supply terminal T20.

The first to fourth connection lines L21 to L24 are also formed as a stripline which has a line length of λ/4 with respect to the wavelength A of a target frequency signal. The first and third connection lines L21, L23 are opposed to each other across a dielectric layer to thereby cause electromagnetic coupling. Similarly, the second and fourth connection lines L22, L24 are opposed to each other across a dielectric layer to thereby cause electromagnetic coupling.

The capacitor C12 is connected at one end to the DC voltage supply terminal T20 and led at the other end to a ground terminal. The capacitor C12 includes at least one pair of electrodes opposed to each other across a ceramic dielectric layer forming the chip, and its capacity varies depending on the dielectric constant and thickness of the ceramic dielectric layer and the electrode area.

In the balun BL3, finally, the first connection line L31 is connected at one end to the unbalanced terminal T12, while the second connection line L32 is connected at one end to the other end of the first connection line L31. The third connection line L33 is electromagnetically coupled to the first connection line L31 and connected at one end to the first balanced terminal T8 and at the other end to the DC voltage supply terminal T20. The fourth connection line L34 is electromagnetically coupled to the second connection line L32 and connected at one end to the second balanced terminal T9 and at the other end to the DC voltage supply terminal T20.

The first to fourth connection lines L31 to L34 are formed as a stripline which has a line length of λ/4 with respect to the wavelength λ of a target frequency signal. The first and third connection lines L31, L33 are opposed to each other across a ceramic dielectric layer to thereby cause electromagnetic coupling. Similarly, the second and fourth connection lines L32, L34 are opposed to each other across a ceramic dielectric layer to thereby cause electromagnetic coupling.

The capacitor C13 is connected at one end to the DC voltage supply terminal T20 and led at the other end to a ground terminal. The capacitor C13 includes at least one pair of electrodes opposed to each other across a ceramic dielectric layer forming the chip, and its capacity varies depending on the dielectric constant and thickness of the ceramic dielectric layer and the electrode area.

In the composite balun according to the present invention, as described above, the plurality of baluns BL1 to BL3 constituting the principal part are built into the single chip 1, so that when incorporating the plurality of baluns BL1 to BL3 into a mobile communication apparatus such as a mobile phone or a wireless LAN device, what is required is just to save a mounting area of a printed circuit board for the single chip, which meets the miniaturization requirement.

In each of the plurality of baluns BL1 to BL3, then, the first connection line (L11, L21, L31) is connected at one end to the unbalanced terminal (T18, T15, T12), while the second connection line (L12, L22, L32) is connected at one end to the other end of the first connection line (L11, L21, L31). In addition, the third connection line (L13, L23, L33) is electromagnetically coupled to the first connection line (L11, L21, L31) and connected at one end to the first balanced terminal (T2, T5, T8), while the fourth connection line (L14, L24, L34) is electromagnetically coupled to the second connection line (L12, L22, L32) and connected at one end to the second balanced terminal (T1, T6, T9). Therefore, there is obtained a composite balun where the third and fourth connection lines (L13, L23, L33), (L14, L24, L34) serve as a balanced transmission line and the first and second connection lines (L11, L21, L31), (L12, L22, L32) serve as an unbalanced transmission line.

On the other hand, the other end of the third connection line (L13, L23, L33) and the other end of the fourth connection line (L14, L24, L34) are connected to the DC voltage supply terminal T20, so that when a power amplifier or a radio frequency integrated circuit requires a DC voltage, the DC voltage can usefully be supplied through the composite balun.

Moreover, since each of the capacitors C11 to C13 is connected at one end to the DC voltage supply terminal T20 and led at the other end to the ground terminal, noise entering through a power supply circuit can be absorbed by the capacitors C11 to C13. Furthermore, since these capacitors C11 to C13 are built into the single chip 1 along with the plurality of baluns BL1 to BL3, the mounting process on the circuit board becomes easier and the required mounting area can be reduced as compared with the case where the capacitors C11 to C13 are disposed outside the composite balun.

Figure 2:
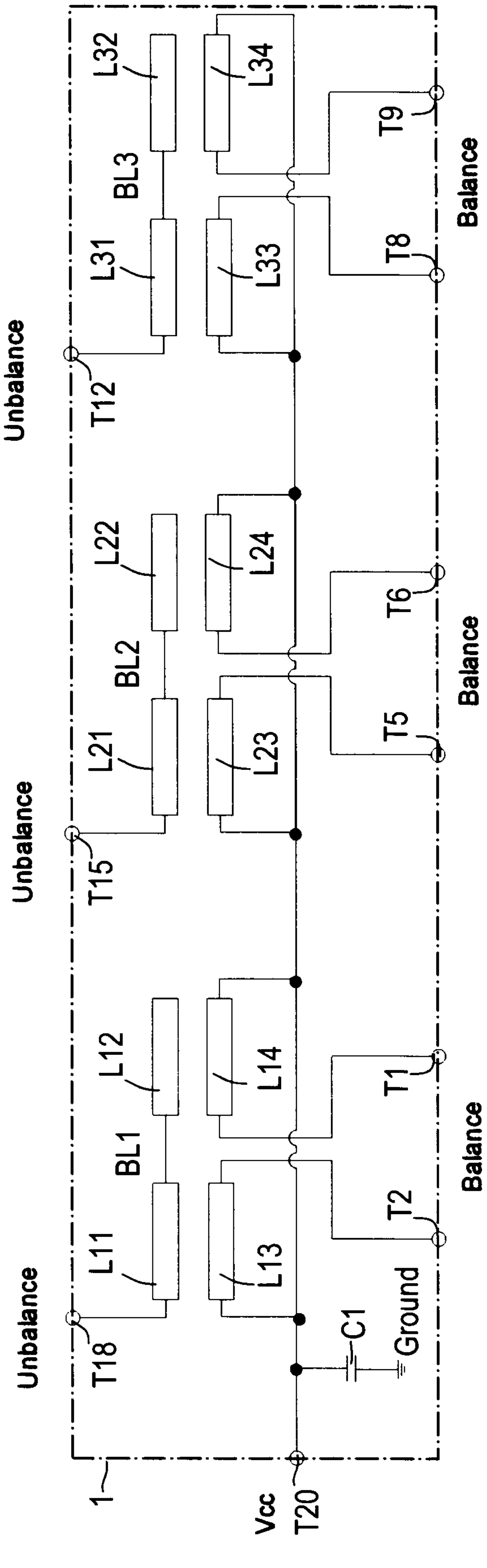
FIG. 2 is a circuit diagram showing a configuration of another embodiment of a composite balun according to the present invention.

Next will be described another embodiment of a composite balun according to the present invention with reference to FIG. 2. In FIG. 2, the components similar to the components shown in FIG. 1 are indicated by the same reference symbols to avoid duplicative explanation. This embodiment is characterized in that the capacitor C1 is shared among the plurality of baluns BL1 to BL3. That is, the circuit has only one capacitor C1 in spite of having a plurality of baluns BL1 to BL3. This capacitor C1 may include a plurality of capacitors that are conceptually connected in parallel or in series and can equivalently be expressed as a single capacitor in an electrical circuit diagram.

Since the above configuration requires only one capacitor C1 in spite of having a plurality of baluns BL1 to BL3, the chip 1 can be miniaturized more. The miniaturization and cost reduction can also be achieved by simplifying the laminated structure of the chip 1.

Next will be described an example of the use of the composite balun of FIG. 2 with reference to FIG. 3. It should be noted that the composite balun of FIG. 1 can also be used under the same condition.

To each unbalanced terminal (T18, T15, T12) of the baluns BL1 to BL3, a power amplifier PA1 to PA3 is connected, while to each pair of balanced terminals (T2, T1), (T5, T6), (T8, T9), a radio frequency integrated circuit RFIC1 to RFIC3 is connected. The baluns BL1 to BL3 are each located between the radio frequency integrated circuit RFIC1 to RFIC3 for a balanced signal and the power amplifier PA1 to PA3 for an unbalanced signal and serve as a balanced-unbalanced transformer.

In the composite balun according to the present invention, as described above, the other end of the third connection line (L13, L23, L33) and the other end of the fourth connection line (L14, L24, L34) are connected to the DC voltage supply terminal T20, so that a DC voltage Vcc can be supplied through the composite balun to the power amplifiers PA1 to PA3 and the radio frequency integrated circuits RFIC1 to RFIC3, which require a DC voltage supply.

Moreover, since the capacitor C1 is connected at one end to the DC voltage supply terminal T20 and led at the other end to the ground terminal GROUND, noise entering through a power supply circuit can be absorbed by the capacitor C1. Furthermore, since the capacitor C1 is built into the single chip 1 along with the plurality of baluns BL1 to BL3, the mounting process on the circuit board becomes easier and the required mounting area can be reduced as compared with the case where the capacitor C1 is disposed outside the composite balun.

Figure 4:
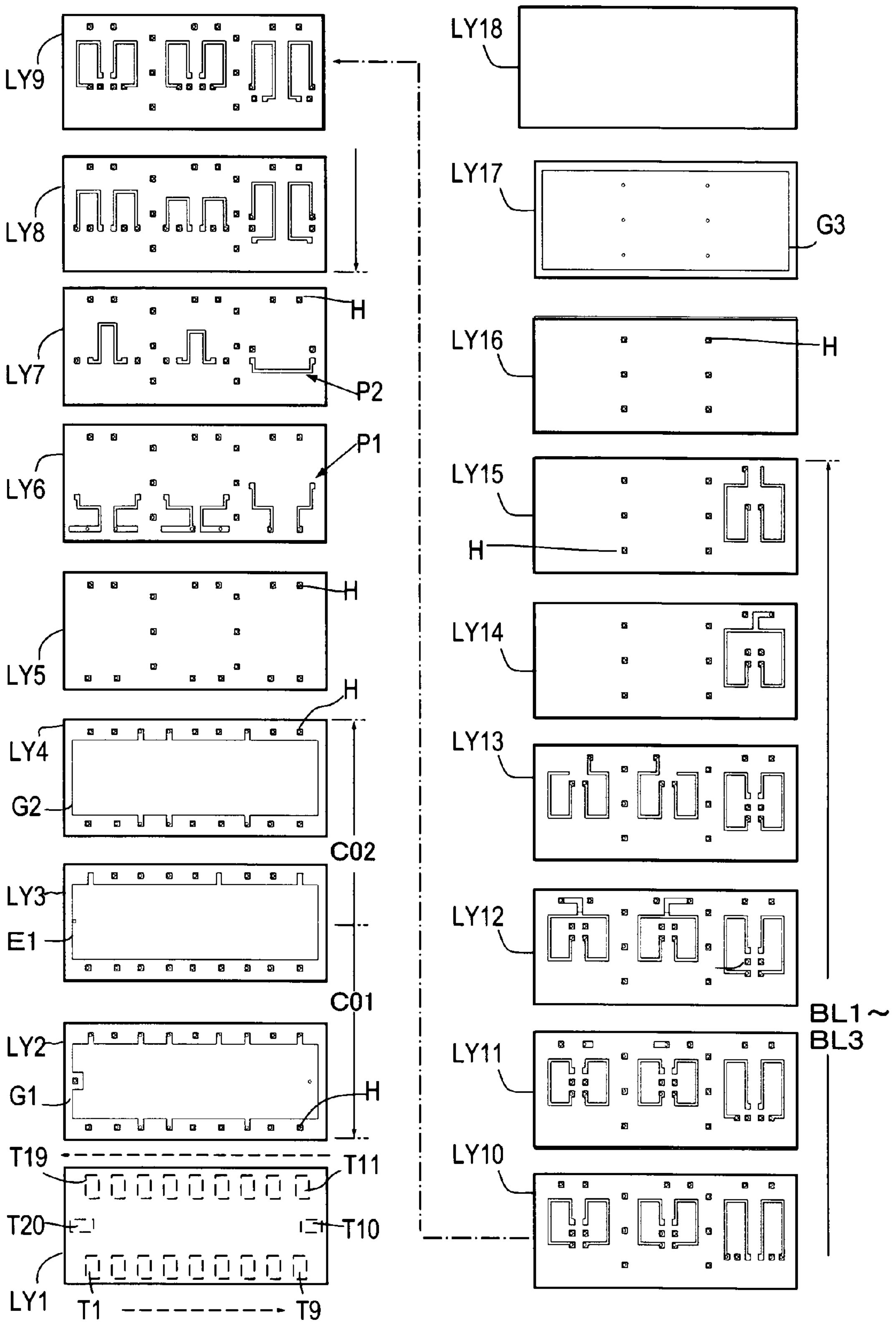
FIG. 4 is an exploded view showing a laminated structure of a composite balun according to the present invention.

Next will be described a concrete laminated structure of the composite balun of FIG. 2 with reference to FIGS. 4 to 7. Referring first to FIG. 4, there is depicted a structure where dielectric layers LY1 to LY18 are sequentially stacked. The dielectric layers LY1 to LY18 are all integrated together by firing after stacking ceramic dielectric sheets. FIG. 4 shows individual layers of the chip 1 in a separated state only for convenience of explanation of the structure, and thus they are not actually separated as shown.

In the lowermost dielectric layer LY1, at first, terminals T1 to T20 are arranged at given intervals along the periphery of the lower surface. Since the terminals T1 to T20 are formed within the lower surface of the dielectric layer LY1, soldering for connection will never form fillet when mounting the composite balun onto the circuit board. This reduces the required mounting area on the circuit board.

Figure 5:
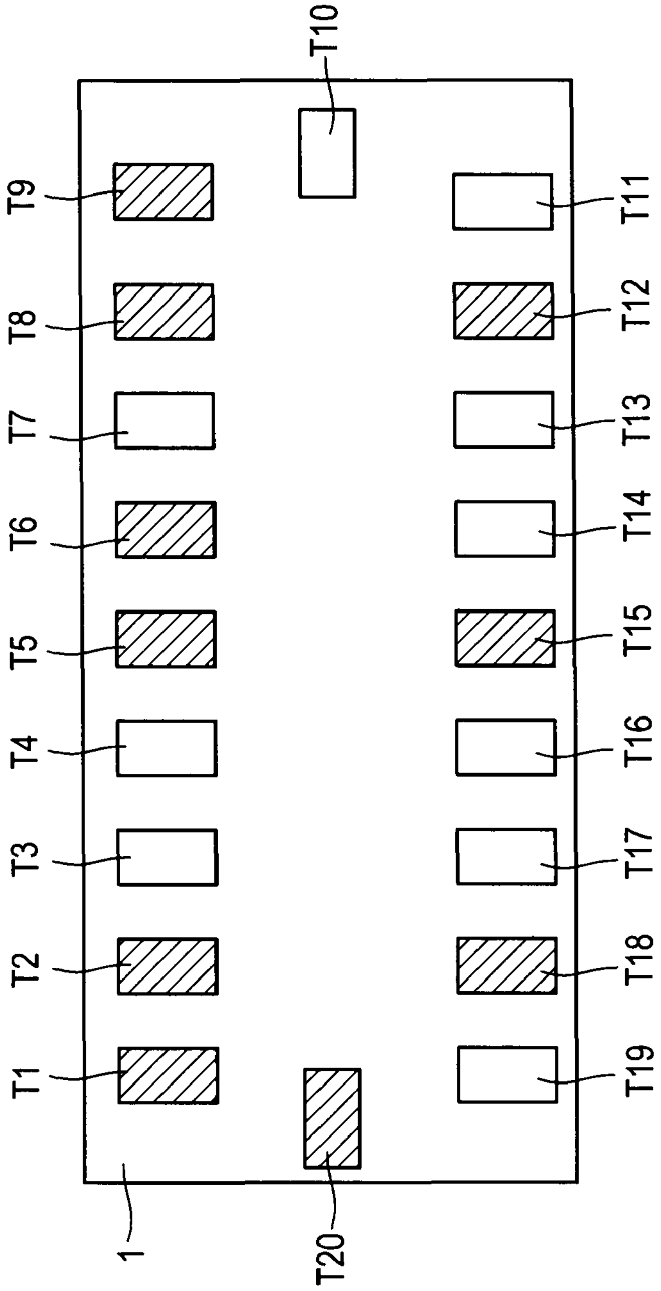
FIG. 5 is a terminal arrangement diagram in which a chip forming a composite balun according to the present invention is viewed from a bottom face side.

Among the terminals T1 to T20, referring to FIG. 5, the terminal T1 is the second balanced terminal of the balun BL1, the terminal T2 is the first balanced terminal, the terminals T5, T6 are the first and second balanced terminals of the balun BL2, and the terminals T8, T9 are the first and second balanced terminals of the balun BL3. On the other hand, the terminal T18 is the unbalanced terminal of the balun BL1, the terminal T15 is the unbalanced terminal of the balun BL2, and the terminal T12 is the unbalanced terminal of the balun BL3. The other terminals T3, T4, T7, T10, T11, T13, T14, T16, T17, T19 are used as the ground terminal. The terminal T20 is the DC voltage supply terminal.

The first and second balanced terminals T2, T1 of the balun BL1, the first and second balanced terminals T5, T6 of the balun BL2, and the first and second balanced terminals T8, T9 of the balun BL3 are arranged on a rectangular bottom face of the chip 1 along one common side. That is, the first balanced terminals (T2, T5, T8) and the second balanced terminals (T1, T6, T9) are arranged on a straight line.

With this terminal arrangement, conductor patterns (connecting lands) corresponding to the first balanced terminals (T2, T5, T8) and the second balanced terminals (T1, T6, T9) can be arranged in a row on the circuit board for mounting the composite balun, which enables facilitation or simplification of routing of the connecting conductor patterns on the circuit board.

In the present embodiment, the unbalanced terminal T18 of the balun BL1, the unbalanced terminal T15 of the balun BL2, and the unbalanced terminal T12 of the balun BL3 are arranged on the bottom face along the other side opposite to the one side where the first balanced terminals (T2, T5, T8) and the second balanced terminals (T1, T6, T9) are arranged. That is, the unbalanced terminals (T18, T15, T12) are arranged on a straight line at positions opposite to the first balanced terminals (T2, T5, T8) and the second balanced terminals (T1, T6, T9). Therefore, the routing of the connecting conductor patterns on the circuit board can be facilitated or simplified for the unbalanced terminals (T18, T15, T12), too.

The other terminals T3, T4, T7, T10, T11, T13, T14, T16, T17, T19 are used as the ground terminal.

The ground terminals T3, T4 are arranged between the first and second balanced terminals (T2, T1) of the balun BL1 and the first and second balanced terminals (T5, T6) of the balun BL2. The ground terminal T7 is arranged between the first and second balanced terminals (T5, T6) of the balun BL2 and the first and second balanced terminals (T8, T9) of the balun BL3.

The ground terminals T17, T16 are arranged between the unbalanced terminal T18 of the balun BL1 and the unbalanced terminal T15 of the balun BL2. The ground terminals T14, T13 are arranged between the unbalanced terminal T15 of the balun BL2 and the unbalanced terminal T12 of the balun BL3.

Moreover, the ground terminal T10 and the DC voltage supply terminal T20 are separately arranged along sides extending between one side where the first balanced terminals (T2, T5, T8) and the second balanced terminals (T1, T6, T9) are arranged and the other side where the unbalanced terminals (T18, T15, T12) are arranged.

Figure 6:
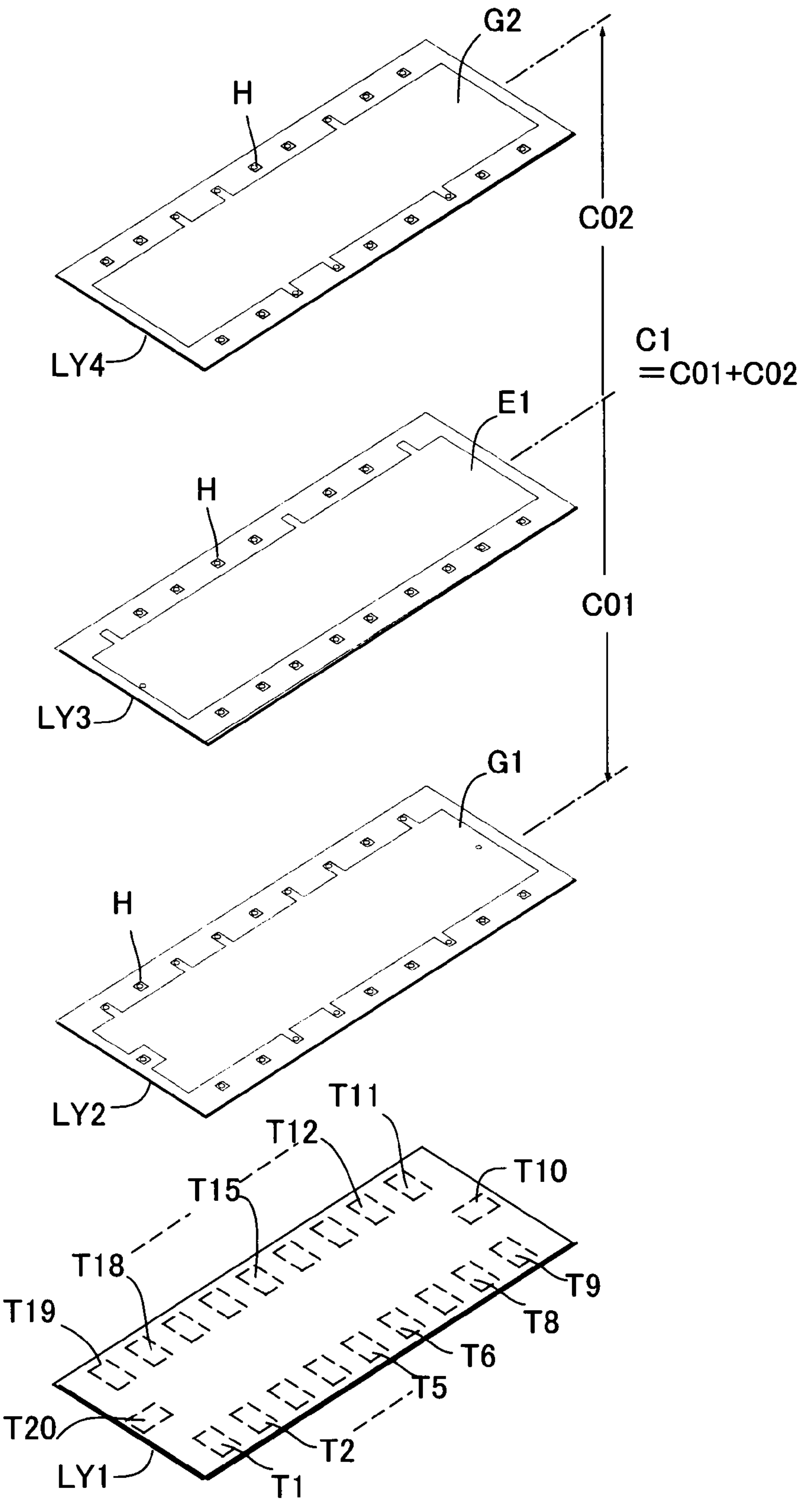
FIG. 6 is a perspective view showing a laminated structure of a capacitor included in the laminated structure of FIG. 4.

Referring again to FIG. 4, the capacitor C1 shown in FIG. 2 is formed by the dielectric layers LY2, LY3, LY4 sequentially stacked on the dielectric layer LY1. Referring to FIG. 6, the capacitor C1 has a structure that a capacity C01 generated between an electrode E1 formed on the intermediate dielectric layer LY3 and a ground electrode G1 formed on the underlying dielectric layer LY2 is connected in parallel to a capacity C02 generated between the electrode E1 of the dielectric layer LY3 and a ground electrode G2 formed on the overlying dielectric layer LY4. Thus, the capacity of the capacitor C1 is C01+C02.

The dielectric layer LY5 overlying the dielectric layer LY4 is a spacer layer with a group of through-electrodes H, on which the dielectric layer LY6 with a group of wiring patterns P1 and the dielectric layer LY7 with a group of wiring patterns P2 are sequentially stacked.

Figure 7:
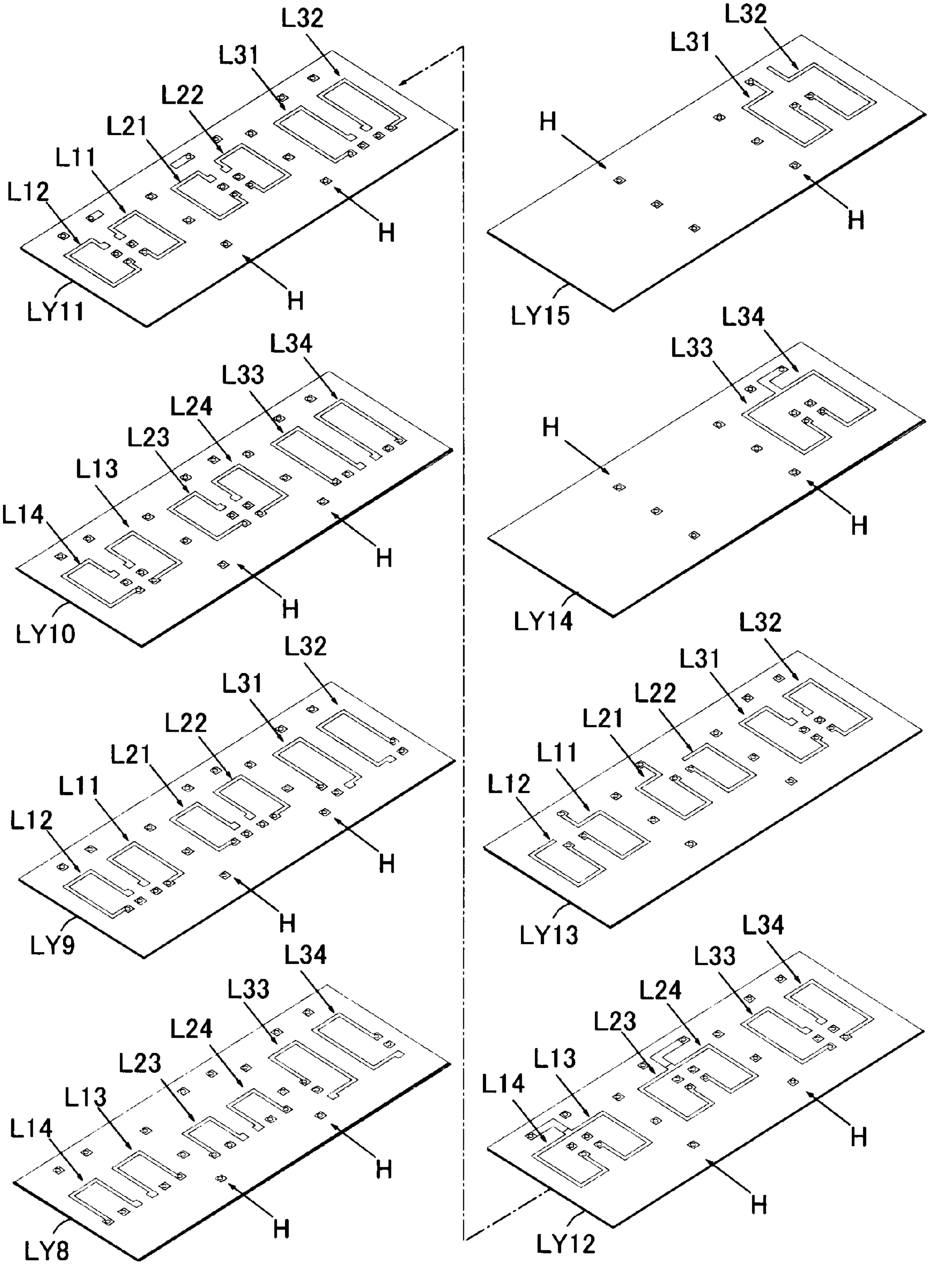
FIG. 7 is a perspective view showing a laminated structure of a balun's principal part included in the laminated structure of FIG. 4.

The dielectric layers LY8 to LY15 sequentially stacked on the dielectric layer LY7 are used for forming the first to fourth connection lines of the baluns BL1 to BL3. Details are shown in FIG. 7.

On one surface of the dielectric layer LY8, at first, a strip-shaped conductor forming the fourth connection line L14 of the balun BL1 and a similar strip-shaped conductor forming the third connection line L13 are arranged side-by-side at a distance from each other in one direction. Beside and spaced apart from the third connection line L13, a strip-shaped conductor forming the third connection line L23 of the balun BL2 and a similar strip-shaped conductor forming the fourth connection line L24 are arranged side-by-side at a distance from each other in one direction. Beside and spaced apart from the fourth connection line L24 of the balun BL2, moreover, a strip-shaped conductor forming the third connection line L33 of the balun BL3 and a similar strip-shaped conductor forming the fourth connection line L34 are arranged side-by-side at a distance from each other in one direction.

On one surface of the dielectric layer LY9 overlying the dielectric layer LY8, then, a strip-shaped conductor forming the second connection line L12 of the balun BL1 and a similar strip-shaped conductor forming the first connection line L11 are arranged side-by-side at a distance from each other in one direction. Beside and spaced apart from the first connection line L11, a strip-shaped conductor forming the first connection line L21 of the balun BL2 and a similar strip-shaped conductor forming the second connection line L22 are arranged side-by-side at a distance from each other in one direction. Beside and spaced apart from the second connection line L22 of the balun BL2, moreover, a strip-shaped conductor forming the first connection line L31 of the balun BL3 and a similar strip-shaped conductor forming the second connection line L32 are arranged side-by-side at a distance from each other in one direction.

Between the dielectric layers LY8, LY9, accordingly, for the balun BL1, the first and third connection lines L11, L13, as well as the second and fourth connection lines L12, L14, are electromagnetically coupled through the dielectric layer LY9. For the balun BL2, the first and third connection lines L21, L23, as well as the second and fourth connection lines L22, L24, are electromagnetically coupled through the dielectric layer LY9. For the balun BL3, moreover, the first and third connection lines L31, L33, as well as the second and fourth connection lines L32, L34, are electromagnetically coupled through the dielectric layer LY9.

On one surface of the dielectric layer LY10 overlying the dielectric layer LY9, then, a strip-shaped conductor forming the fourth connection line L14 of the balun BL1 and a similar strip-shaped conductor forming the third connection line L13 are arranged side-by-side at a distance from each other in one direction. Beside and spaced apart from the third connection line L13, a strip-shaped conductor forming the third connection line L23 of the balun BL2 and a similar strip-shaped conductor forming the fourth connection line L24 are arranged side-by-side at a distance from each other in one direction. Beside and spaced apart from the fourth connection line L24 of the balun BL2, moreover, a strip-shaped conductor forming the third connection line L33 of the balun BL3 and a similar strip-shaped conductor forming the fourth connection line L34 are arranged side-by-side at a distance from each other in one direction.

Between the dielectric layers LY9, LY10, accordingly, for the balun BL1, the first and third connection lines L11, L13, as well as the second and fourth connection lines L12, L14, are electromagnetically coupled through the dielectric layer LY10. For the balun BL2, the first and third connection lines L21, L23, as well as the second and fourth connection lines L22, L24, are electromagnetically coupled through the dielectric layer LY10. For the balun BL3, moreover, the first and third connection lines L31, L33, as well as the second and fourth connection lines L32, L34, are electromagnetically coupled through the dielectric layer LY10.

On one surface of the dielectric layer LY11 overlying the dielectric layer LY10, then, a strip-shaped conductor forming the second connection line L12 of the balun BL1 and a similar strip-shaped conductor forming the first connection line L11 are arranged side-by-side at a distance from each other in one direction. Beside and spaced apart from the first connection line L11, a strip-shaped conductor forming the first connection line L21 of the balun BL2 and a similar strip-shaped conductor forming the second connection line L22 are arranged side-by-side at a distance from each other in one direction. Beside and spaced apart from the second connection line L22 of the balun BL2, moreover, a strip-shaped conductor forming the first connection line L31 of the balun BL3 and a similar strip-shaped conductor forming the second connection line L32 are arranged side-by-side at a distance from each other in one direction.

Between the dielectric layers LY10, LY11, accordingly, for the balun BL1, the first and third connection lines L11, L13, as well as the second and fourth connection lines L12, L14, are electromagnetically coupled through the dielectric layer LY11. For the balun BL2, the first and third connection lines L21, L23, as well as the second and fourth connection lines L22, L24, are electromagnetically coupled through the dielectric layer LY11. For the balun BL3, moreover, the first and third connection lines L31, L33, as well as the second and fourth connection lines L32, L34, are electromagnetically coupled through the dielectric layer LY11.

On one surface of the dielectric layer LY12 overlying the dielectric layer LY11, then, a strip-shaped conductor forming the fourth connection line L14 of the balun BL1 and a similar strip-shaped conductor forming the third connection line L13 are arranged side-by-side at a distance from each other in one direction. Beside and spaced apart from the third connection line L13, a strip-shaped conductor forming the third connection line L23 of the balun BL2 and a similar strip-shaped conductor forming the fourth connection line L24 are arranged side-by-side at a distance from each other in one direction. Beside and spaced apart from the fourth connection line L24 of the balun BL2, moreover, a strip-shaped conductor forming the third connection line L33 of the balun BL3 and a similar strip-shaped conductor forming the fourth connection line L34 are arranged side-by-side at a distance from each other in one direction.

Between the dielectric layers LY11, LY12, accordingly, for the balun BL1, the first and third connection lines L11, L13, as well as the second and fourth connection lines L12, L14, are electromagnetically coupled through the dielectric layer LY12. For the balun BL2, the first and third connection lines L21, L23, as well as the second and fourth connection lines L22, L24, are electromagnetically coupled through the dielectric layer LY12. For the balun BL3, moreover, the first and third connection lines L31, L33, as well as the second and fourth connection lines L32, L34, are electromagnetically coupled through the dielectric layer LY12.

On one surface of the dielectric layer LY13 overlying the dielectric layer LY12, then, a strip-shaped conductor forming the second connection line L12 of the balun BL1 and a similar strip-shaped conductor forming the first connection line L11 are arranged side-by-side at a distance from each other in one direction. Beside and spaced apart from the first connection line L11, a strip-shaped conductor forming the first connection line L21 of the balun BL2 and a similar strip-shaped conductor forming the second connection line L22 are arranged side-by-side at a distance from each other in one direction. Beside and spaced apart from the second connection line L22 of the balun BL2, moreover, a strip-shaped conductor forming the first connection line L31 of the balun BL3 and a similar strip-shaped conductor forming the second connection line L32 are arranged side-by-side at a distance from each other in one direction.

Between the dielectric layers LY12, LY13, accordingly, for the balun BL1, the first and third connection lines L11, L13, as well as the second and fourth connection lines L12, L14, are electromagnetically coupled through the dielectric layer LY13. For the balun BL2, the first and third connection lines L21, L23, as well as the second and fourth connection lines L22, L24, are electromagnetically coupled through the dielectric layer LY13. For the balun BL3, moreover, the first and third connection lines L31, L33, as well as the second and fourth connection lines L32, L34, are electromagnetically coupled through the dielectric layer LY13.

On one surface of the dielectric layer LY14 overlying the dielectric layer LY13, a strip-shaped conductor forming the third connection line L33 of the balun BL3 and a similar strip-shaped conductor forming the fourth connection line L34 are arranged side-by-side at a distance from each other in one direction.

Between the dielectric layers LY13, LY14, accordingly, for the balun BL3, the first and third connection lines L31, L33, as well as the second and fourth connection lines L32, L34, are electromagnetically coupled through the dielectric layer LY14.

On one surface of the dielectric layer LY15 overlying the dielectric layer LY14, a strip-shaped conductor forming the first connection line L31 of the balun BL3 and a similar strip-shaped conductor forming the second connection line L32 are arranged side-by-side at a distance from each other in one direction.

Between the dielectric layers LY14, LY15, accordingly, for the balun BL3, the first and third connection lines L31, L33, as well as the second and fourth connection lines L32, L34, are electromagnetically coupled through the dielectric layer LY15.

As describe above, since the electromagnetic coupling between the first connection line (L11, L21, L31) and the third connection line (L13, L23, L33), as well as the electromagnetic coupling between the second connection line (L12, L22, L32) and the fourth connection line (L14, L24, L34), is superimposed through the layers, there is obtained a high and stable degree of coupling. This enables further reduction of the connection line length per one dielectric layer, thereby decreasing its plane area, so that a necessary line length can be obtained while aiming at miniaturization.

Figure 3:
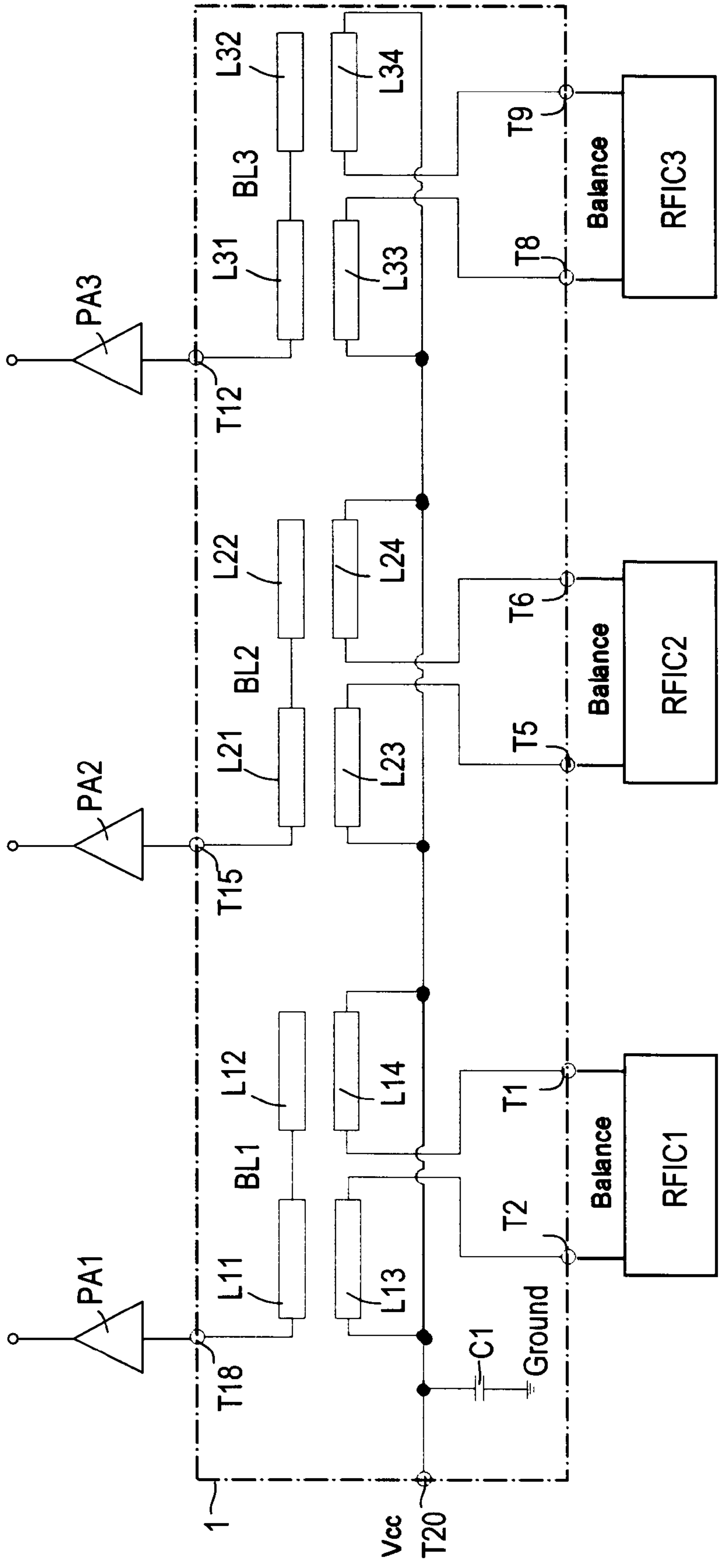
FIG. 3 is a circuit diagram showing the composite balun of FIG. 2 under service conditions.

The same connection lines formed on the dielectric layers LY8 to LY15 are electrically connected together through the through-electrodes H to provide the circuit configuration shown in FIGS. 2 and 3. For instance, the fourth connection line L14 formed on the dielectric layer LY8, the fourth connection line L14 formed on the dielectric layer LY10, and the fourth connection line L14 formed on the dielectric layer LY12 are connected substantially in series through the through-electrodes H. The first connection line (L11, L21, L31), the second connection line (L12, L22, L32), the third connection line (L13, L23, L33), and the fourth connection line (L24, L34) are also connected through the through-electrodes H in a similar manner.

Referring again to FIG. 4, the layers having the ground electrodes G1, G2 of the capacitor C1 are disposed beneath the dielectric layers LY8 to LY15 forming the baluns BL1 to BL3, while the dielectric layer LY17 having a ground electrode G3 is disposed above it. That is, the baluns BL1 to BL3 are sandwiched between the first ground electrodes G1, G2 and the second ground electrode G3. Therefore, this shield structure provides a stable shielding effect.

The shielding effect can also be obtained by the through-electrodes H. The through-electrodes H not only connect the first connection line (L11, L21, L31), the second connection line (L12, L22, L32), the third connection line (L13, L23, L33), and the fourth connection line (L14, L24, L34) for forming a desired circuit, as described above, but also connect the upper and lower ground electrodes G1, G2, G3 electrically.

If the group of the through-electrodes H connected to the ground electrodes G1, G2, G3 are formed with high density between the baluns BL1, BL2 or between the baluns BL2, BL3, mutual interference between the baluns can be effectively blocked.

The present invention has been described in detail above with reference to preferred embodiments. However, obviously those skilled in the art could easily devise various modifications of the invention based on the technical concepts underlying the invention and teachings disclosed herein.

What is claimed is:

1. A composite balun comprising a plurality of baluns, at least one capacitor, a ground terminal, and a DC voltage supply terminal, wherein said plurality of baluns and said capacitor are built into a single chip, each of said baluns includes first to fourth connection lines, a first balanced terminal, a second balanced terminal, and an unbalanced terminal, said first connection line is connected at one end to said unbalanced terminal, said second connection line is connected at one end to the other end of said first connection line, said third connection line is electromagnetically coupled to said first connection line and connected at one end to said first balanced terminal and at the other end to said DC voltage supply terminal, said fourth connection line is electromagnetically coupled to said second connection line and connected at one end to said second balanced terminal and at the other end to said DC voltage supply terminal, said capacitor is connected at one end to said DC voltage supply terminal and led at the other end to said ground terminal, and said capacitor is shared among said plurality of baluns.

2. The composite balun of claim 1, wherein said chip has a rectangular bottom face, and said first balanced terminals and said second balanced terminals are arranged on said bottom face along one common side.

3. The composite balun of claim 2, wherein said unbalanced terminals are arranged on said bottom face along the other side opposite to said one side.

4. The composite balun of claim 3, wherein said first balanced terminals and said second balanced terminals are arranged on a straight line, said unbalanced terminals are arranged on a straight line at positions opposite to said first balanced terminals and said second balanced terminals, and said DC voltage supply terminal is arranged along a side extending between said one side and said the other side.

* * * * *

UNITED STATES PATENT AND TRADEMARK OFFICE

CERTIFICATE OF CORRECTION

PATENT NO. : 8,324,981 B2
APPLICATION NO. : 12/774972
DATED : December 4, 2012
INVENTOR(S) : Shoichi Ohi et al.

It is certified that error appears in the above-identified patent and that said Letters Patent is hereby corrected as shown below:

On the title page, Item (30), should read:

--(30) Foreign Application Priority Data

May 26, 2009 (JP)............................... 2009-126349
June 12, 2009 (JP)............................... 2009-003992--

Signed and Sealed this
Fifth Day of March, 2013

Teresa Stanek Rea
*Acting Director of the United States Patent and Trademark Office*